(12) United States Patent
Ramsden

(10) Patent No.: US 6,388,449 B1
(45) Date of Patent: May 14, 2002

(54) CIRCUIT AND METHOD FOR AUTO-CALIBRATION OF AN ACTIVE LOAD

(75) Inventor: Martin H. Ramsden, Lawrenceville, GA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/818,027

(22) Filed: Mar. 27, 2001

(51) Int. Cl.⁷ .............................................. G10N 37/416
(52) U.S. Cl. ........................................ 324/426; 341/120
(58) Field of Search ................................. 324/426, 429, 324/430; 341/118, 120, 1 JJ; 320/127, 135

(56) References Cited

U.S. PATENT DOCUMENTS

| | | |
|---|---|---|
| 5,621,406 A | 4/1997 | Goetzinger |
| 5,745,060 A | 4/1998 | McCartney |
| 5,825,316 A | 10/1998 | Kuttner |
| 5,861,828 A | 1/1999 | Opris |
| 5,926,123 A | 7/1999 | Ostrom |
| 6,057,891 A | 5/2000 | Guerin |
| 6,140,948 A | 10/2000 | Yu |
| 6,184,809 B1 | 2/2001 | Yu |
| 6,198,432 B1 | 3/2001 | Yu |

*Primary Examiner*—Edward H. Tso
(74) *Attorney, Agent, or Firm*—Philip H. Burrus, IV

(57) ABSTRACT

This invention includes an auto-calibration circuit for eliminating errors due to resistor tolerances in measurement circuits. In many instances, an analog to digital (A/D) converter is called upon to measure signals that have voltages higher than the operation voltage of the converter. As a result, resistive dividers are employed to step the voltage down to an acceptable level. One preferred embodiment of this invention includes an auto-calibration circuit comprising a comparator, transistor and voltage reference. When the auto-calibration circuit is enabled, the auto-calibration circuit switches in a reference voltage. The firmware embedded in a control device, like a microprocessor for example, is then able to extrapolate the tolerance error associated with the resistive divider.

8 Claims, 3 Drawing Sheets

CIRCUIT AND METHOD FOR AUTO-CALIBRATION OF AN ACTIVE LOAD

BACKGROUND

1. Technical Field

This invention relates generally to measurement circuits, and more specifically to a circuit for auto-calibration of measurement circuits including analog to digital converters.

2. Background Art

Many electronic devices need to make accurate measurements to operate properly. For example, a household thermostat needs to be able to measure the temperature to properly operate a furnace or air conditioner. When a person sets the heat at 68°, they expect the heat to come on when the temperature of the room falls below 68° If the thermostat's "thermal measurement system", which is technical language for a "thermometer", cannot measure the room temperature accurately, it never knows exactly how cold the room is. As can be seen, proper measurement is critical to the thermostat's operation.

Likewise, in electronic circuits, there are many needs for measurement accuracy. One such example is a cellular phone battery. Many cellular phones today have "gas gauges" on the screens that tell you how much battery power you have left. Additionally, lithium and nickel-based battery chargers generally measure the battery voltage to decide when to stop charging. Thus, battery measurement is a critical system in battery charging.

Many systems today use integrated circuits to measure battery voltage. These circuits often include an analog to digital (A/D) converter. An A/D converter reads an analog level, like a battery voltage for example, and converts it into a digital word that a microprocessor, microcomputer or other digital circuitry can understand.

One problem with A/D converters is that they must be calibrated. While they are very good at measuring differential changes, they need to be calibrated to measure absolute magnitudes. In other words, while a digital thermometer is very good at measuring a change from 75 to 80 degrees, a calibration is required to tell the thermometer exactly where 80 degrees occurs.

By way of example, when you purchase wristwatch, you must first manually set the watch to the correct time. This is calibration. From that time on, the watch measures the time accurately. A/D converters must be initially calibrated in the same fashion.

Another problem with A/D converters is that from time to time the calibration may drift. This is analogous to a watch running a little fast or a little slow. Consequently, the A/D converter must be recalibrated occasionally to keep the readings accurate.

One prior art solution for calibration is to occasionally measure the ground voltage and set the digital output to zero. This approach has two inherent problems. First, the ground potential often includes quite a bit of noise. Consequently, what the A/D converter thinks is zero may actually be half a volt or minus half a volt.

Second, the ground measurement often does not take into consideration the electrical components. For example, if a filter circuit is between ground and the A/D input, tolerances in the components will not be measured when ground is measured.

There is thus a need for an improved auto-calibration circuit and method.

DETAILED DESCRIPTION OF THE INVENTION

Figure 1:
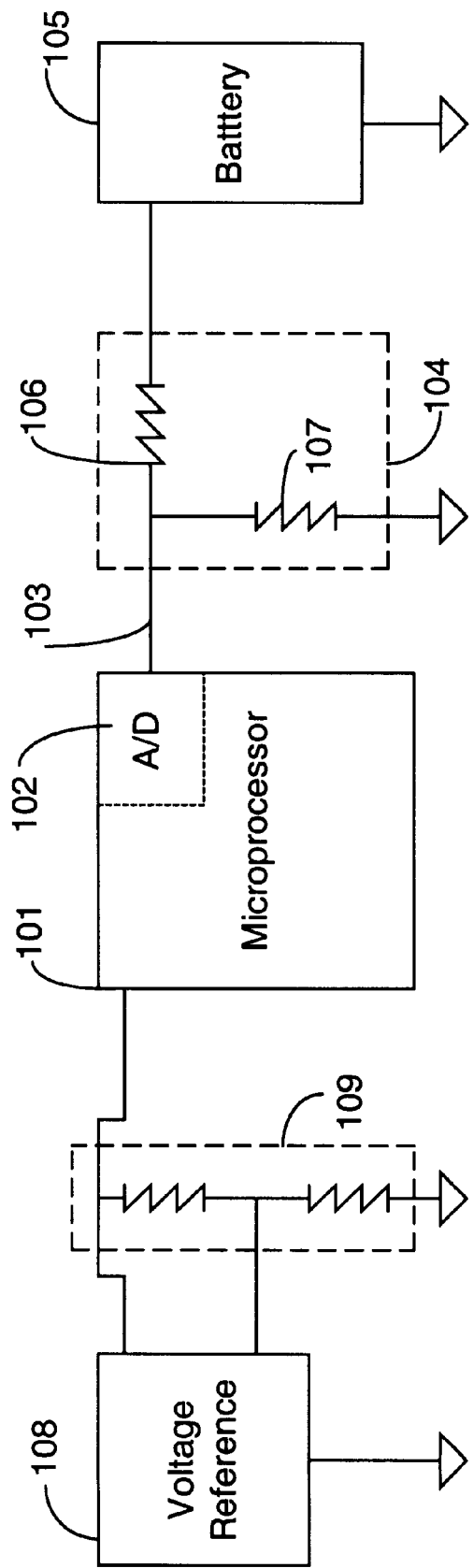
FIG. 1 is a prior art circuit.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

In the interest of simplicity, the invention will be discussed with reference to a battery charging circuit. It will be clear to those of ordinary skill in the art that the circuit is not so limited. It is applicable to other circuits that include A/D converters.

Referring now to FIG. 1, illustrated therein is a prior art battery charging circuit 100. The battery charging is controlled by a microprocessor 101 that runs embedded code. While a microprocessor 101 is the easiest circuit to employ, other digital devices, including programmable logic arrays, programmable gate arrays, and other similar devices could also be used.

In this embodiment, the microprocessor 101 has at least one A/D converter 102 for measuring the voltage of at least one battery cell 105. The A/D converter could be onboard (as shown in FIG. 1) or external to the microprocessor 101. The A/D converter 102 receives an input analog voltage from the center-point 103 of a resistive divider 104. The resistive divider 104 is used in this embodiment because many microprocessors on the market, like the uPD78F series manufactured by NEC for example, are capable of operating from a 3.3 volt (or less) supply voltage. As lithium batteries generally charge to about 4.1 volts, if the battery 105 voltage were fed directly into the A/D converter 102, an erroneous reading would occur when the A/D converter 102 tried to compare the 4.1 volt battery voltage to the 3.3 volt supply reference. Consequently, the resistive divider 104 steps down the voltage of the battery 105 so that is readable by the A/D converter 102.

In an exemplary embodiment, the upper resistor 106 and the lower resistor 107 are approximately the game impedance, so the battery voltage is divided roughly in half. A problem exists in this embodiment in that both the upper resistor 106 and the lower resistor 107 have tolerances associated with them. Thus, while the microprocessor 101 thinks that the division of battery voltage is exactly one half, it may actually be 0.495 or 0.513, for example. The system thus needs a means of calibration to eliminate the resistive divider tolerances.

The microprocessor 101 receives its reference voltage from an external voltage reference. The A/D converter 102 uses this reference voltage when making measurements. The reference voltage must therefore be accurate for the measurements to be accurate. Some voltage references, like the TL431 manufactured by Motorola establish alternate outputs via a control loop comprising a resistive divider network. Other references have a dedicated output. Microprocessors are capable of running from precision references with voltages at various voltages. Consequently, a resistor divider is optional and depends upon the microprocessor used. For exemplary purposes, in this embodiment a second resistive divider 109 is shown to establish the reference output.

One possible prior art solution to the tolerance problem associated with the first resistor divider 104 is to use precision resistors. In other words, instead of using 5% resistors, just buy 0.05% resistors. The problem with this solution is that precision resistors can cost as much as 100 times as much as regular 5% or 10% resistors. This can make electronic devices cost prohibitive.

Figure 2:
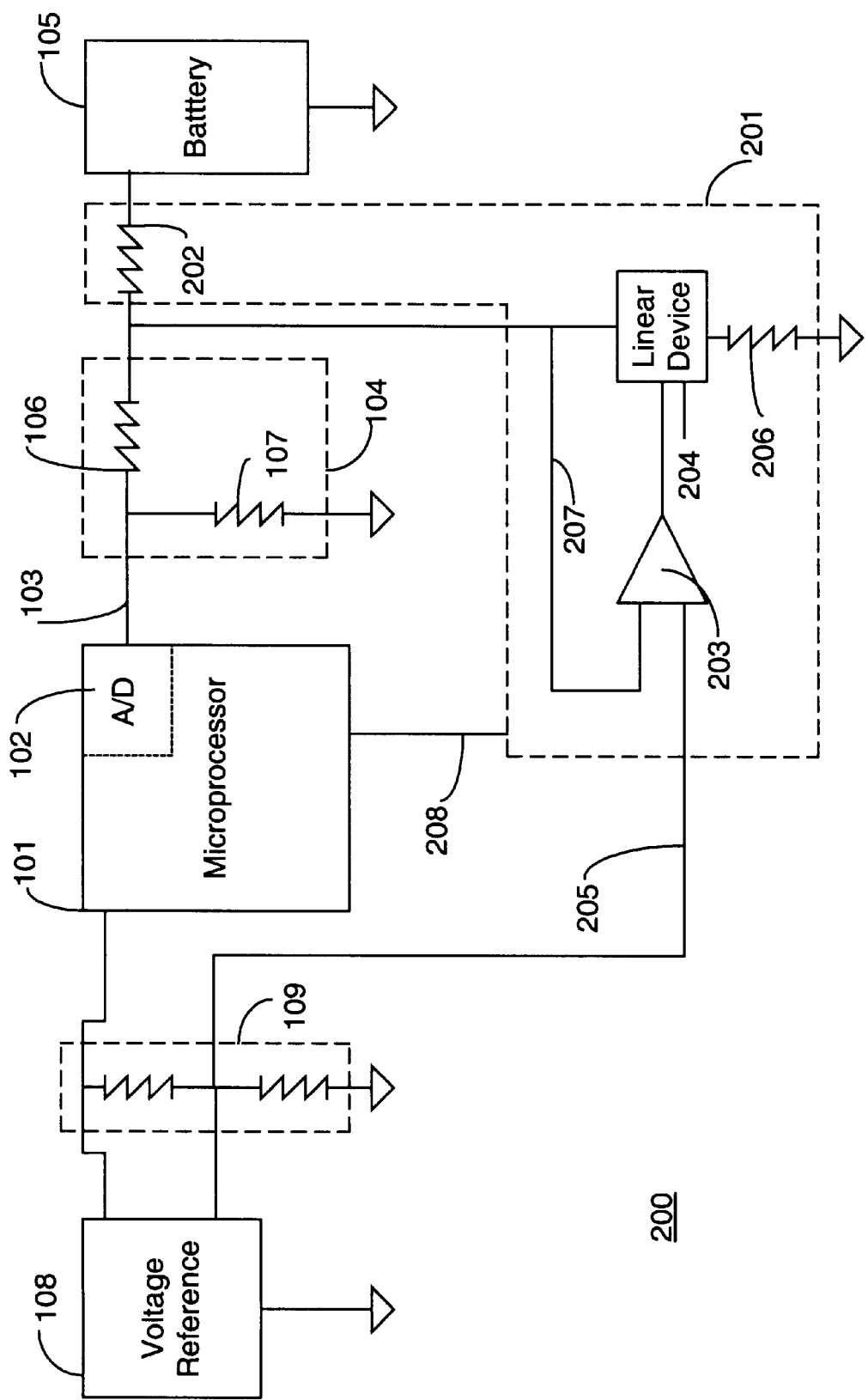
FIG. 2 is a schematic diagram of a preferred embodiment in accordance with the invention.

Referring now to FIG. 2, illustrated therein is a schematic diagram 200 in accordance with the invention. The circuit includes a preferred embodiment of an auto-calibration circuit 201, as well an additional resistor 202 between the battery 105 and the first resistive divider. The auto-calibration circuit 201 allows the microprocessor 101 to calibrate out errors due to tolerances in the first resistive divider 104. The microprocessor 101 actuates the auto-calibration circuit 201 via an enable control line 208.

In one preferred embodiment, the auto-calibration circuit 201 comprises a comparator 203, a linear device 204, a first resistor 202 and a second resistor 206. The comparator 203 includes a feedback control loop 207 that causes the linear device to be biased such that the voltage at the feedback control loop 207 is exactly equal to the precision voltage from the voltage regulator. As this exemplary embodiment includes a second resistive divider 109 to step up the supply voltage for the microprocessor 101, the precision voltage appears midpoint of the second resistor divider network 109, hereinafter called the reference voltage 205. As stated above, often the microprocessor 101 will use the reference voltage 205 as its operating voltage, thereby obviating the need for the second resistive divider 109.

As a result, when the microprocessor enables the enable line 208, the autocalibration circuit 201 causes the node between the battery 105 and the upper resistor 106 of the first voltage divider 104 to be clamped at the reference voltage 205 from the second voltage divider 109. The first resistor 202 and the second resistor 206 provide a means of dissipating energy caused by the difference between the voltage of the battery 105 and the reference voltage 205.

The A/D converter 102 thus receives a voltage input that is equal to the reference voltage 205, divided down by the first voltage divider 104, when the enable line 208 is actuated. As the firmware embedded in the microprocessor knows what the reference voltage 205 is, the firmware can extrapolate the tolerances of the resistors. For example, if the reference voltage 205 is 2.5 volts, and the A/D measures 1.125 volts (which is the 2.5 volt reference divided by the resistive divider), the microprocessor 101 knows that the resistor dividers are causing measurements to be 10% low. (One half of 2.5 would be 1.25, and the actual reading is 1.125, 10% less than 1.25.)

After performing the auto-calibration step, the microprocessor 101 then deactuates the enable line 208, allowing the voltage from the battery 105 to feed into the first resistive divider 104. Note that the linear device 204, which is generally a transistor, goes into a high impedance state such that the auto-calibration circuit 201 does not affect the battery measurement. When the microprocessor 101 gets a battery reading, it simply adjusts the measurement by 10% in the firmware. In this manner, the tolerances of the first voltage divider have been effectively removed.

The auto-calibration circuit 201 has other advantages. One such advantage includes the ability to discharge the battery 105. When lithium based batteries are charged above their recommended termination voltage, they may release gasses causing cell performance to be compromised. When the microprocessor 101 detects a battery 105 that has been overcharged, it should discharge the battery 105 to a voltage below the recommended termination voltage. The auto-calibration circuit 201 has a dual operative mode that allows this to occur.

When the microprocessor 101 detects an overcharged battery 105, it 101 actuates the auto-calibration circuit 201. When this occurs, the battery 105 has a load across it comprised of the first resistor 202, the linear device 204 and the second resistor 206. The microprocessor 101 can keep the auto-calibration circuit 201 actuated, thereby allowing the battery to discharge into the first resistor 202 and the second resistor 206. As the first resistor 202 and the second resistor 206 are generally on the order of tens of ohms, while the resistors in the first resistor divider 104 can be on the order of tens to hundreds of thousands of ohms, the small resistance associated with the first resistor 202 does not compromise the accuracy of the auto-calibration circuit with respect to the first resistor divider 104.

Figure 3:
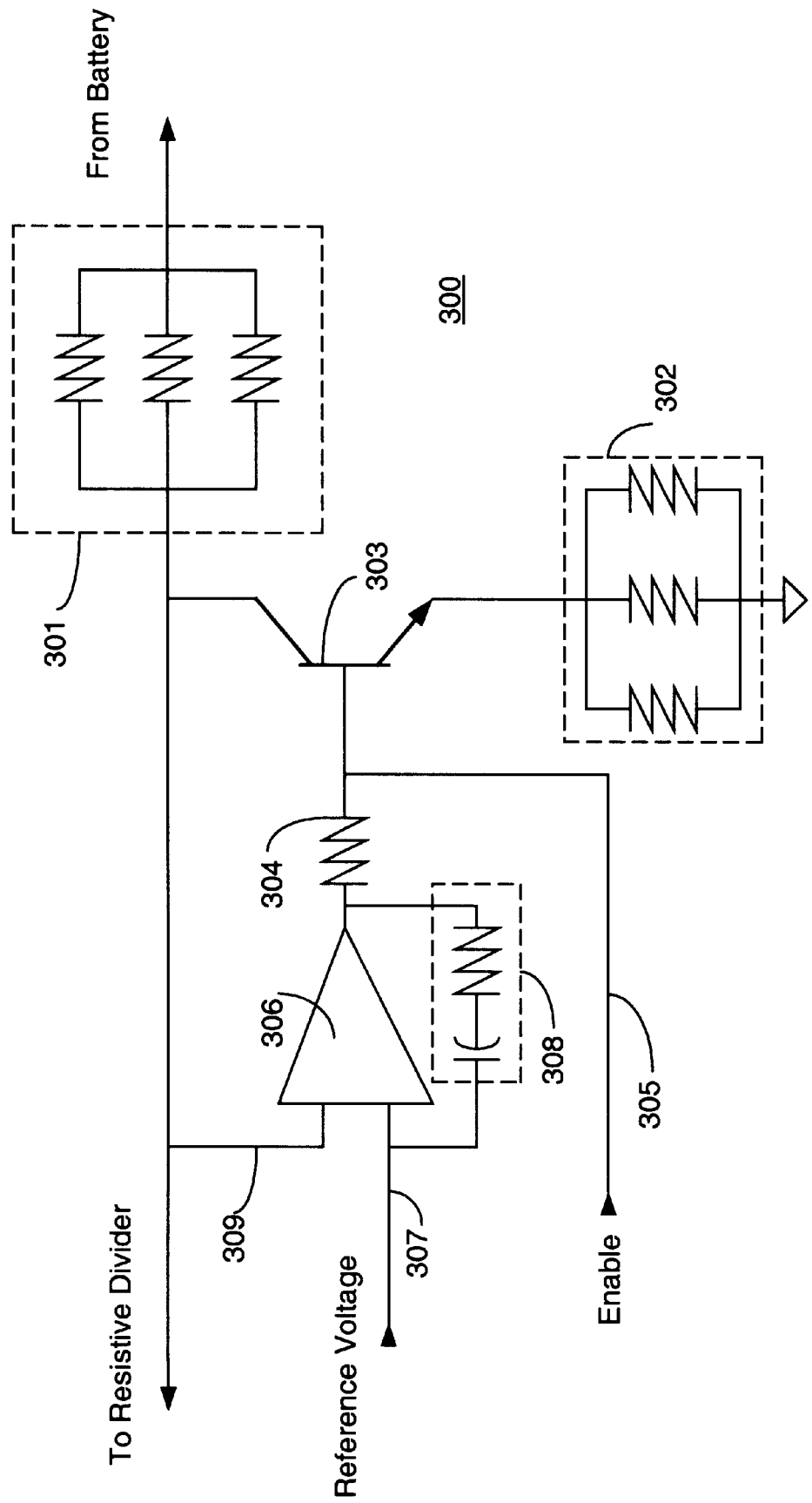
FIG. 3 is an exemplary embodiment in accordance with the invention.

Referring now to FIG. 3, illustrated therein is an exemplary embodiment of an auto-calibration circuit in accordance with the invention 300. The circuit includes a first bank of resistors 301, a second bank of resistors 302, a transistor 303, a feedback loop 308, and enable input 305 and a reference voltage input 307.

The first resistor bank 301 corresponds to the first resistor 202 in FIG. 2. Likewise, the second resistor bank corresponds to the second resistor 206 in FIG. 2. In this exemplary embodiment, a parallel group of three resistors has been used to increase the power dissipation capability of the equivalent resistance. As these resistors 301,302 can be used to discharge a battery, the additional power dissipation capability is desirable. Instead of placing an expensive 1.5 watt resistor for example, three less expensive 0.5 watt resistors can be placed at a lower overall total cost. In this exemplary embodiment, three 22 ohm resistors were selected.

A bipolar junction transistor (BJT) 303 was selected as the pass element. It will be obvious to those of ordinary skill in the art that other transistors, including metal oxide field effect transistors (MOSFETs), junction field effect transistors (JFETs), and equivalents thereof could be substituted. A BJT 303 was selected because it provides adequate switching time and a cost that is lower than most field effect transistors.

The BJT 303 is generally controlled by the comparator 306. This control function can be overridden, however, by the microprocessor by actuating the enable input 305. Note that the series resistor 304 allows this enable override without disrupting the operation of the comparator 306.

A negative feedback loop 308 is provided. In this exemplary embodiment, the loop 308 comprises a resistor and capacitor. By varying the values of resistance and capacitance, one may tailor the transient response to suit a desired need. The negative feedback loop 308 also provides switching stability.

The reference voltage is coupled to the negative input of the comparator 307, while the voltage between the BJY 303 and the first resistor bank 301 in coupled to the positive input 309. This coupling forces the voltage between the BJT 303 and the first resistor bank 301 to be equal to the reference voltage when the circuit 300 is actuated.

While the preferred embodiments of the invention have been illustrated and described, it is clear that the invention is not so limited. Numerous modifications, changes, variations, substitutions, and equivalents will occur to those skilled in the art without departing from the spirit and scope of the present invention as defined by the following claims. For example, while this invention has been described as relating to battery chargers, it is clear that the circuit is easily applicable to any circuit in which an A/D converter measures a voltage that is greater than its maximum input voltage.

What is claimed is:

1. A circuit for auto-calibration of resistor tolerances, the circuit comprising:
   a. at least one analog to digital converter;
   b. at least one resistor divider coupled in series between a signal to be measured and the at least one analog to digital converter;
   c. a reference voltage; and
   d. a linear auto-calibration circuit having an enable input, wherein when the enable input is actuated, the at least one analog to digital converter is coupled to the reference voltage, with the at least one resistor divider is coupled serially therebetween.

2. The circuit of claim 1, wherein the linear auto-calibration circuit comprises a comparator.

3. The circuit of claim 2, wherein the linear auto-calibration circuit further comprises a linear device.

4. The circuit of claim 3, wherein the linear device is a transistor.

5. The circuit of claim 4, wherein the linear device is selected from the group consisting of bipolar junction transistors, metal oxide field effect transistors, junction field effect transistors, and equivalents thereof.

6. The circuit of claim 4, wherein the auto-calibration circuit further comprises at least one resistor.

7. A battery charger comprising the circuit of claim 1.

8. The charger of claim 7, wherein the auto-calibration circuit is alternately used to discharge a battery cell.

* * * * *